US009048342B2

(12) United States Patent
Kwai et al.

(10) Patent No.: US 9,048,342 B2
(45) Date of Patent: Jun. 2, 2015

(54) SEMICONDUCTOR DEVICE STACKED STRUCTURE

(75) Inventors: Ding-Ming Kwai, Hsinchu County (TW); Yung-Fa Chou, Kaohsiung (TW); Chiao-Ling Lung, Hsinchu County (TW); Jui-Hung Chien, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 461 days.

(21) Appl. No.: 13/450,482

(22) Filed: Apr. 19, 2012

(65) Prior Publication Data

US 2013/0161819 A1   Jun. 27, 2013

(30) Foreign Application Priority Data

Dec. 21, 2011   (TW) .............................. 100147767 A

(51) Int. Cl.
*H01L 23/48*  (2006.01)
*H01L 23/52*  (2006.01)
(Continued)

(52) U.S. Cl.
CPC .............. *H01L 24/94* (2013.01); *H01L 23/481* (2013.01); *H01L 25/0657* (2013.01); *H01L 2224/1301* (2013.01); *H01L 2224/13111* (2013.01); *H01L 2224/13144* (2013.01); *H01L 2224/13147* (2013.01); *H01L 2224/1316* (2013.01); *H01L 2224/13184* (2013.01); *H01L 2224/16145* (2013.01); *H01L 2224/94* (2013.01); *H01L 2924/3511* (2013.01);
(Continued)

(58) Field of Classification Search
USPC .......................... 257/774, 775, 773; 438/639
See application file for complete search history.

(56) References Cited

U.S. PATENT DOCUMENTS

| 5,072,075 A | 12/1991 | Lee et al. |
| 5,191,174 A | 3/1993 | Chang et al. |

(Continued)

FOREIGN PATENT DOCUMENTS

| CN | 101038908 | 9/2007 |
| CN | 101740415 | 6/2010 |

(Continued)

OTHER PUBLICATIONS

"Allowance of Taiwan Counterpart Application", issued on May 22, 2014, p. 1-p. 4.

(Continued)

*Primary Examiner* — Errol Fernandes
(74) *Attorney, Agent, or Firm* — Jianq Chyun IP Office

(57) ABSTRACT

A semiconductor device stacked structure is disclosed, which includes multiple semiconductor devices and at least one reinforcing structure. The semiconductor devices are stacked on one another. At least one semiconductor device has at least one through silicon via. Each reinforcing structure surrounds a corresponding one of the at least one through silicon via and is electrically insulated from the semiconductor devices. The at least one reinforcing structure includes multiple reinforcing elements and at least one connecting element. Each reinforcing element is disposed between the semiconductor devices. Vertical projections of the reinforcing elements on a plane define a close region, and a projection of the at least one through silicon via on the plane is located within the close region. The connecting element is located in an overlapping region of the vertical projections of the reinforcing elements on the plane, for connecting the reinforcing elements to form the reinforcing structure.

21 Claims, 6 Drawing Sheets

(51) Int. Cl.
*H01L 29/40* (2006.01)
*H01L 23/00* (2006.01)
*H01L 25/065* (2006.01)
*H01L 23/58* (2006.01)

(52) U.S. Cl.
CPC ............ *H01L 2225/06513* (2013.01); *H01L 2225/06544* (2013.01); *H01L 2924/10253* (2013.01); *H01L 23/562* (2013.01); *H01L 23/585* (2013.01); *H01L 24/13* (2013.01); *H01L 24/16* (2013.01)

(56) References Cited

U.S. PATENT DOCUMENTS

| | | | |
|---|---|---|---|
| 5,250,843 | A | 10/1993 | Eichelberger |
| 5,278,726 | A | 1/1994 | Bernardoni et al. |
| 6,081,036 | A | 6/2000 | Hirano et al. |
| 6,119,338 | A | 9/2000 | Wang et al. |
| 6,122,171 | A | 9/2000 | Akram et al. |
| 6,160,705 | A | 12/2000 | Stearns et al. |
| 6,235,554 | B1 | 5/2001 | Akram et al. |
| 6,274,821 | B1 | 8/2001 | Echigo et al. |
| 6,316,285 | B1 | 11/2001 | Jiang et al. |
| 6,660,559 | B1 | 12/2003 | Huemoeller et al. |
| 6,730,857 | B2 | 5/2004 | Konrad et al. |
| 6,740,964 | B2 | 5/2004 | Sasaki |
| 6,774,748 | B1 | 8/2004 | Ito et al. |
| 6,815,709 | B2 | 11/2004 | Clothier et al. |
| 6,888,240 | B2 | 5/2005 | Towle et al. |
| 6,919,514 | B2 | 7/2005 | Konrad et al. |
| 6,931,726 | B2 | 8/2005 | Boyko et al. |
| 6,963,141 | B2 | 11/2005 | Lee et al. |
| 7,005,321 | B2 | 2/2006 | Chee |
| 7,015,075 | B2 | 3/2006 | Fay et al. |
| 7,015,570 | B2 | 3/2006 | Emma et al. |
| 7,067,352 | B1 | 6/2006 | Scheid |
| 7,185,426 | B1 | 3/2007 | Hiner et al. |
| 7,189,593 | B2 | 3/2007 | Lee |
| 7,218,005 | B2 | 5/2007 | Tago |
| 7,239,020 | B2 | 7/2007 | Morkner |
| 7,242,082 | B2 | 7/2007 | Eide |
| 7,345,361 | B2 | 3/2008 | Mallik et al. |
| 7,355,273 | B2 | 4/2008 | Jackson et al. |
| 7,429,786 | B2 | 9/2008 | Karnezos et al. |
| 7,750,459 | B2 | 7/2010 | Dang et al. |
| 7,763,965 | B2 | 7/2010 | Webb |
| 7,799,613 | B2 | 9/2010 | Dang et al. |
| 2004/0113278 | A1* | 6/2004 | Dalton et al. .............. 257/774 |
| 2009/0189289 | A1* | 7/2009 | Kacker et al. ............. 257/774 |
| 2011/0031581 | A1 | 2/2011 | West |
| 2011/0084744 | A1* | 4/2011 | Nishioka et al. ........... 327/161 |
| 2011/0101531 | A1 | 5/2011 | Neuilly et al. |

FOREIGN PATENT DOCUMENTS

| | | |
|---|---|---|
| CN | 102148220 | 8/2011 |
| CN | 102263090 | 11/2011 |
| TW | 200924034 | 6/2009 |
| TW | 201108335 | 3/2011 |
| TW | 201117341 | 5/2011 |
| TW | 201120995 | 6/2011 |
| TW | 201121375 | 6/2011 |

OTHER PUBLICATIONS

Zhang et al., "Development of Through Silicon Via (TSV) Interposer Technology for Large Die (21×21mm) Fine-pitch Cu/low-k FCBGA Package," Proceeding of 59th Electronic Components and Technology Conference, May 26-29, 2009, pp. 305-312.

Yu et al., "Three Dimensional Interconnects with High Aspect Ratio TSVs and Fine Pitch Solder Microbumps," Proceeding of 59th Electronic Components and Technology Conference, May 26-29, 2009, pp. 350-354.

Selvanayagam et al.,"Nonlinear Thermal Stress/Strain Analyses of Copper Filled TSV (Through Silicon Via) and Their Flip-Chip Microbumps," IEEE Transactions on Advanced Packaging, Nov. 2009, pp. 720-728, vol. 32, No. 4.

Yu et al., "Fabrication of Silicon Carriers With TSV Electrical Interconnections and Embedded Thermal Solutions for High Power 3-D Packages," IEEE Transactions on Components and Packaging Technologies, Sep. 2009, pp. 566-571, vol. 32, No. 3.

Kim et al, "Application of Through Mold Via (TMV) as PoP Base Package," 58th Electronic Components and Technology Conference, May 27-30, 2008, pp. 1089-1092.

http://www.electroiq.com/articles/ap/print/volume-17/issue-1/departments/editorial-board/package-on-package-pop-with-through-mold-vias.html, retrieved on Jun. 4, 2012, "Package-on-package (PoP) with Through-Mold Vias".

"Office Action of China Counterpart Application," issued on Feb. 16, 2015, pp. 1-5.

* cited by examiner

SEMICONDUCTOR DEVICE STACKED STRUCTURE

CROSS-REFERENCE TO RELATED APPLICATION

This application claims the priority benefit of Taiwan application serial no. 100147767, filed Dec. 21, 2011. The entirety of the above-mentioned patent application is hereby incorporated by reference herein and made a part of this specification.

BACKGROUND

1. Technical Field

The disclosure relates to a stacked structure, and more particular, to a semiconductor device stacked structure.

2. Related Art

In the current information society, the trend of electronic product design is toward lightweight, thin, short, and small in size. As such, the development of various packaging technologies, such as the stack-type semiconductor device packaging technology, is advantageous in miniaturization of the semiconductor package.

In a stack-type semiconductor device package, a plurality of semiconductor devices is packaged in the same package structure in a vertically stacked manner. This can increase package density to miniaturize the package structure, reduce the length of signal transmission path between the semiconductor devices by means of a 3D-stacked manner to increase the speed of signal transmission between the semiconductor devices, as well as combine semiconductor devices having different functions into the same package structure.

In the existing stack-type semiconductor device package, a plurality of through silicon vias (TSV) is usually formed in the semiconductor devices to provide electrical connection paths in a vertical direction. The TSV requires good thermo-mechanical reliability for mass production. However, due to the difference of the coefficient of thermal expansion (CTE) between the TSV filler material and the silicon chip, thermal stress tends to be produced in the TSV, resulting in a plastic deformation, stress induced voiding and stress migration. The interfacial stress can cause peeling and TSV pop-up or even lead to an irremediable failure such as chip fracture.

SUMMARY

A semiconductor device stacked structure is introduced herein. The semiconductor device stacked structure includes a number of semiconductor devices and at least one reinforcing structure. The semiconductor devices are stacked on one another. At least one semiconductor device has at least one through silicon via. Each of the at least one reinforcing structure surrounds a corresponding one of the at least one through silicon via and is electrically insulated from the semiconductor devices. The at least one reinforcing structure includes a number of reinforcing elements and at least one connecting element. Each reinforcing element is disposed between the semiconductor devices. Vertical projections of the reinforcing elements on a plane define a close region, and a projection of the at least one through silicon via on the plane is located within the close region. The connecting element is located in an overlapping region of the vertical projections of the reinforcing elements on the plane, for connecting the reinforcing elements to form the reinforcing structure.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
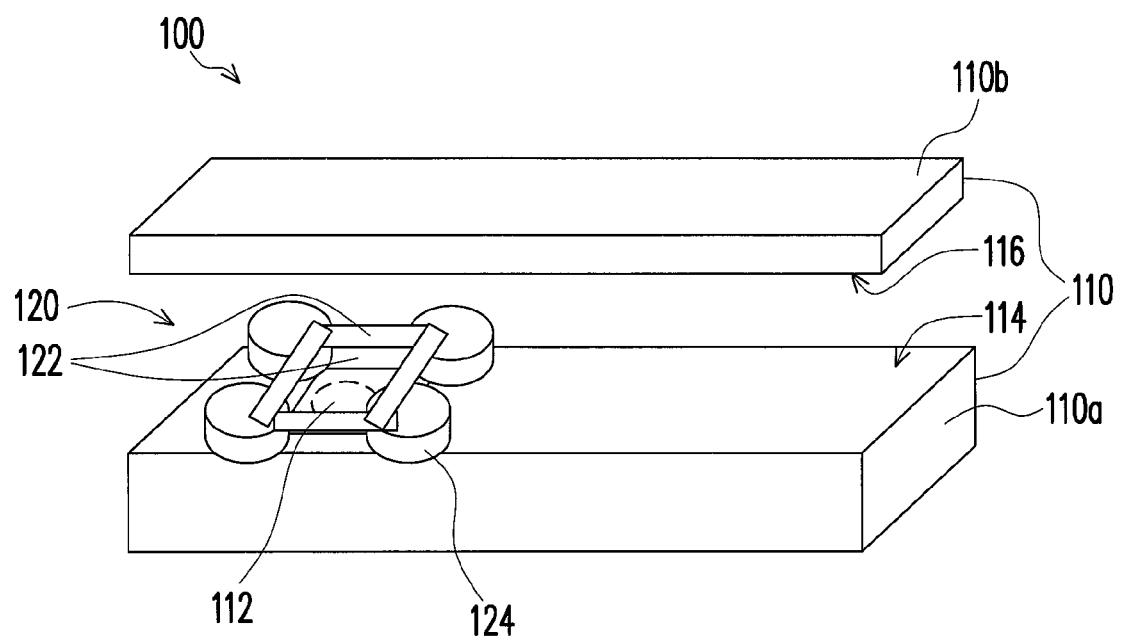
FIG. 1 is a partial, exploded view illustrating a semiconductor device stacked structure according to an exemplary embodiment.
Figure 2:
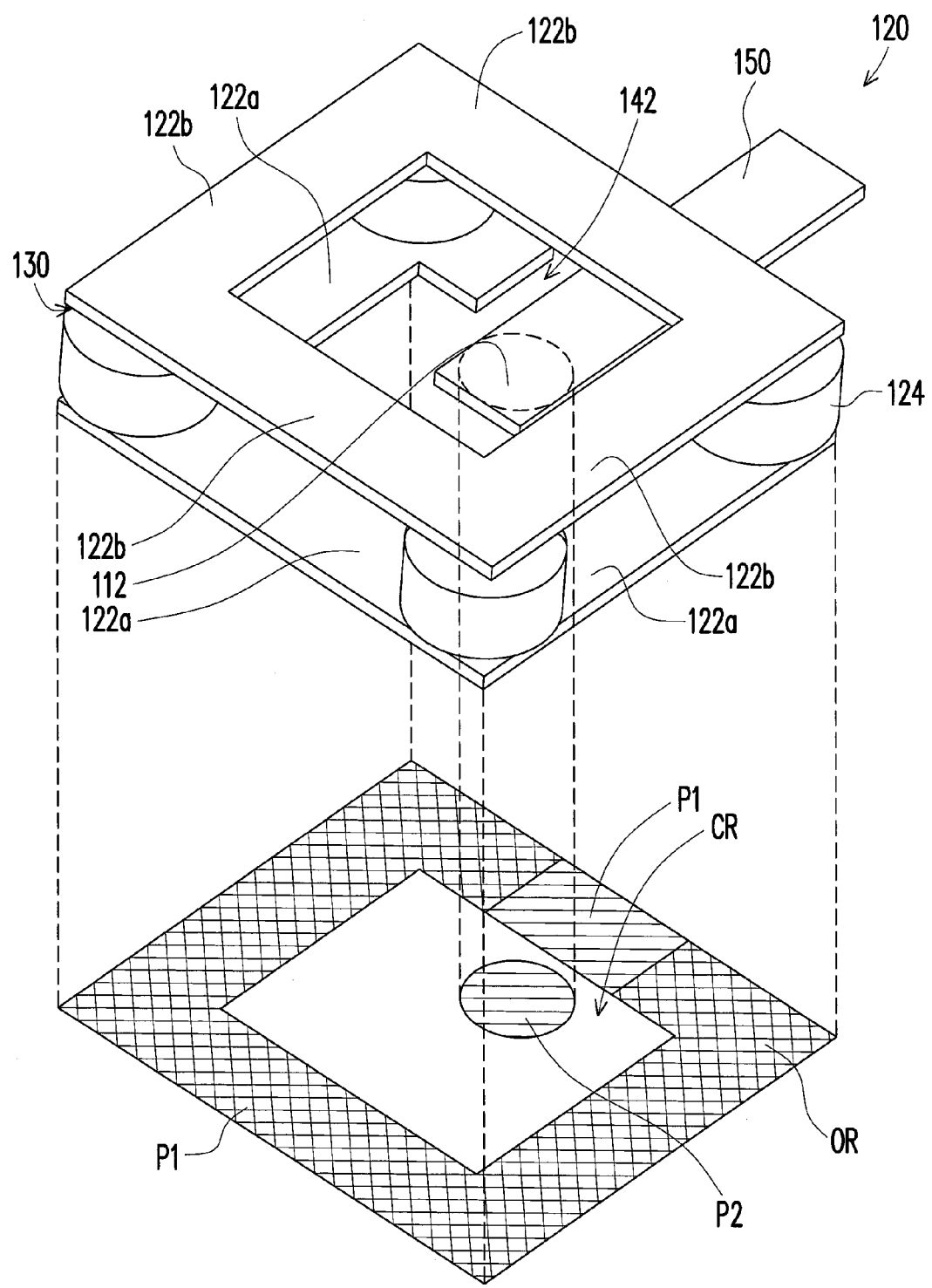
FIG. 2 is a schematic view illustrating projections of a reinforcing structure and through silicon via (TSV) on a plane according to an exemplary embodiment.

FIG. 1 is a partial, exploded view illustrating a semiconductor device stacked structure according to an exemplary embodiment. FIG. 2 is a schematic view illustrating projections of a reinforcing structure and through silicon via (TSV) on a plane according to an exemplary embodiment. In FIG. 1, an upper semiconductor device 110 is separated from a reinforcing structure 120 to more clearly show the reinforcing structure 120. Referring to FIG. 1 and FIG. 2, one embodiment of the disclosure provides a semiconductor device stacked structure 100 that includes a plurality of semiconductor devices 110 (two semiconductor devices 110 are illustrated) and a reinforcing structure 120. The semiconductor devices 110 are stacked on one another and one of the semiconductor devices 110 includes a TSV 112. In the present embodiment, the semiconductor devices 110 include a first semiconductor device 110a and a second semiconductor device 110b that are stacked on each other. The TSV 112 may be disposed in the first semiconductor device 110a, or disposed between the first semiconductor device 110a and the second semiconductor device 110b, or passing through both of the first semiconductor device 110a and the second semiconductor device 110b, which depends on the actual circuit layout of the first semiconductor device 110a and the second semiconductor device 110b. It is noted, however, that the present disclosure does not intend to limit the number of the semiconductor devices and the TSVs, or the location of the TSVs among the semiconductor devices.

The reinforcing structure 120 surrounds a corresponding TSV 112 and is electrically insulated from the semiconductor devices 110. That is, the reinforcing structure 120 does not establish an electrical connection with the TSV 112 and other active elements on the semiconductor devices 110. While one reinforcing structure 120 is illustrated in the present embodiment that corresponds to the TSV 112 in the semiconductor devices 110, in practice, the number and location of the reinforcing structure 120 can be varied according to the number and location of the TSV 112 in the semiconductor devices 110.

The reinforcing structure 120 of the present embodiment includes a plurality of reinforcing elements 122 and at least one connecting element 124. The reinforcing elements 122 are disposed between the semiconductor devices 110. A vertical projection P1 of the reinforcing elements 122 on a plane defines a close region CR, and a projection P2 of the TSV 112 on the plane is located within the close region CR. The connecting element 124 is located in an overlapping region OR of the vertical projections P1 of the reinforcing elements 122 on the plane, for connecting the reinforcing elements 122 to form the reinforcing structure 120. In other words, in the reinforcing structure 120, the plurality of reinforcing elements 122 on different planes are connected through the connecting element 124 in the overlapping region OR.

In the present embodiment, the first semiconductor device 110a has a first surface 114 that faces a second surface 116 of the second semiconductor device 110b. The reinforcing elements 122 include at least one first reinforcing element 122a and at least one second reinforcing element 122b. The first reinforcing element 122a is disposed on the first surface 114, and the second reinforcing element 122b is disposed on the second surface 116. There are a plurality of the connecting elements 124, which are disposed between the first surface 114 and the second surface 116 for connecting the first reinforcing element 122a and the second reinforcing element 122b. In other embodiments of the disclosure, the first reinforcing element and the second reinforcing element may be also disposed on surfaces of the semiconductor devices that are not adjacent each other, and the projection of the first reinforcing element and the projection of the second reinforcing element on a plane define a close region CR.

Specifically, the semiconductor device stacked structure 100 further includes a buffer layer 130 disposed between the first reinforcing element 122a and the second reinforcing element 122b for absorbing deformation of the semiconductor devices 110 caused by thermal stress around the TSV 112. The buffer layer 130 may further increase the rigidity of the first reinforcing element 122a and the second reinforcing element 122b, such that the stress distribution in the semiconductor device stacked structure 100 is more uniform. In the present embodiment, the first semiconductor device 110a and the second semiconductor device 110b may be a chip, an interposer, a wafer or a package. The first reinforcing element 122a may be a first surface layer metal pattern of the first semiconductor device 110a, and the second reinforcing element 122b may be a second surface metal pattern of the second semiconductor device 110b. The material of the connecting element 124 includes metals that have similar coefficient of thermal expansion (CTE), such as, copper, tin, iron, gold, tungsten, steel and composite, compound and alloy of the above metals. The connecting element 124 may be round, square or triangular in shape. In the present embodiment, the connecting element 124 is a solder ball. In the construction described above, the semiconductor devices 110 may use their own structure to form the reinforcing structure 120 that surrounds the TSV 112, which can in principle reduce the possibilities of warp deformation of the semiconductor devices 110 and reduce the stress around the TSV 112.

Figure 3:
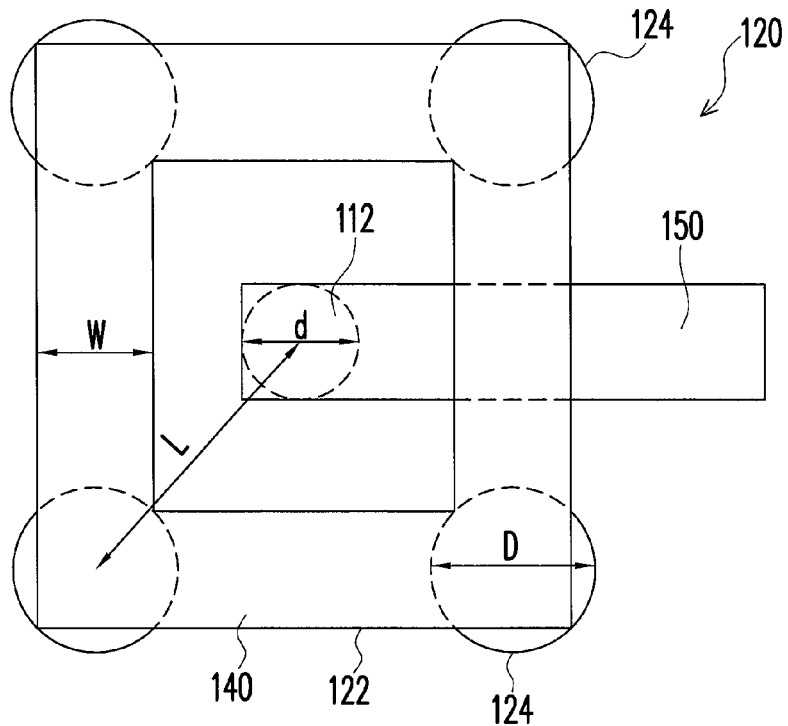
FIG. 3 is a schematic top view illustrating the reinforcing structure according to an exemplary embodiment.

FIG. 3 is a schematic top view illustrating the reinforcing structure according to an exemplary embodiment. Referring to FIG. 3, the size of the reinforcing structure 120 and the TSV 112 should be in an appropriate ratio to achieve a good thermal stress reducing result. In the present embodiment, the ratio of an outer diameter D of the connecting element 124 to a width W of the reinforcing element 122 is greater than or equal to 0.5 but less than or equal to 1.5; the ratio of an outer diameter d of the TSV 112 to the outer diameter D of the connecting element 124 is less than or equal to 2. The distance from a center of the TSV 112 to a center of each connecting element 124 is L, where $L \leq 2(d+D)$. In addition, the CTE of the materials of each connecting element 124 and the TSV 112 is in a ratio ranging from 0.75 to 1.25.

Figure 4:
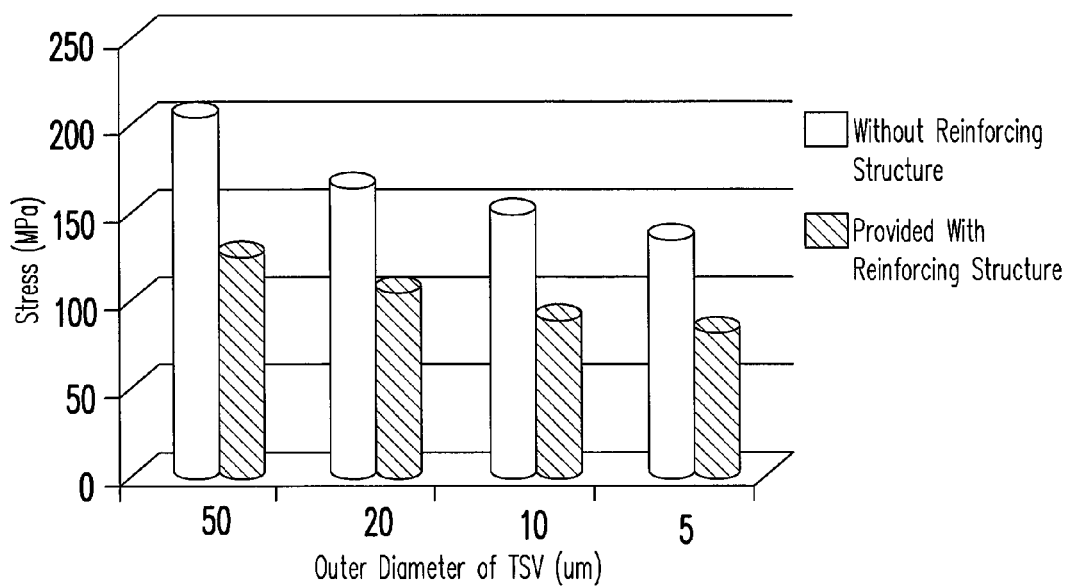
FIG. 4 is a chart illustrating a stress comparison between the semiconductor devices having a reinforcing structure and the semiconductor devices without the reinforcing structure.

FIG. 4 is a chart illustrating a stress comparison between the semiconductor devices having a reinforcing structure and the semiconductor devices without the reinforcing structure. In FIG. 4, the horizontal axis represents the outer diameter of the TSV, the vertical axis represents the stress around the TSV, and the columns filled with shadow lines represent the values of stress around the TSV of the semiconductor device stacked structure of the present embodiment under different outer diameters of the TSV. As can be seen from FIG. 4, for the semiconductor devices that are provided with a reinforcing structure having a size in the above described ratio to the outer diameter of the TSV, the stress around the TSV is in principle reduced, and the fracture due to overlarge stress in the conventional semiconductor devices can be reduced in comparison with those of the semiconductor devices that are not provided with the reinforcing structure.

Figure 5A:
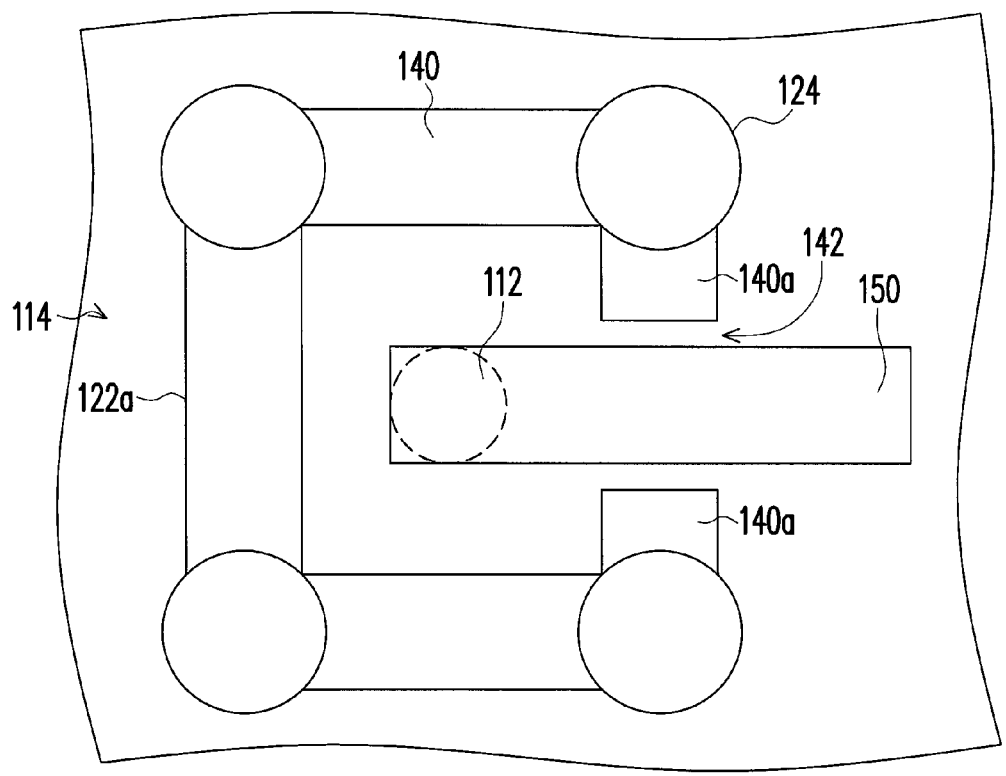
FIG. 5A to FIG. 5E are top, partial views illustrating the reinforcing structures according to five different exemplary embodiments, respectively.
Figure 5B:
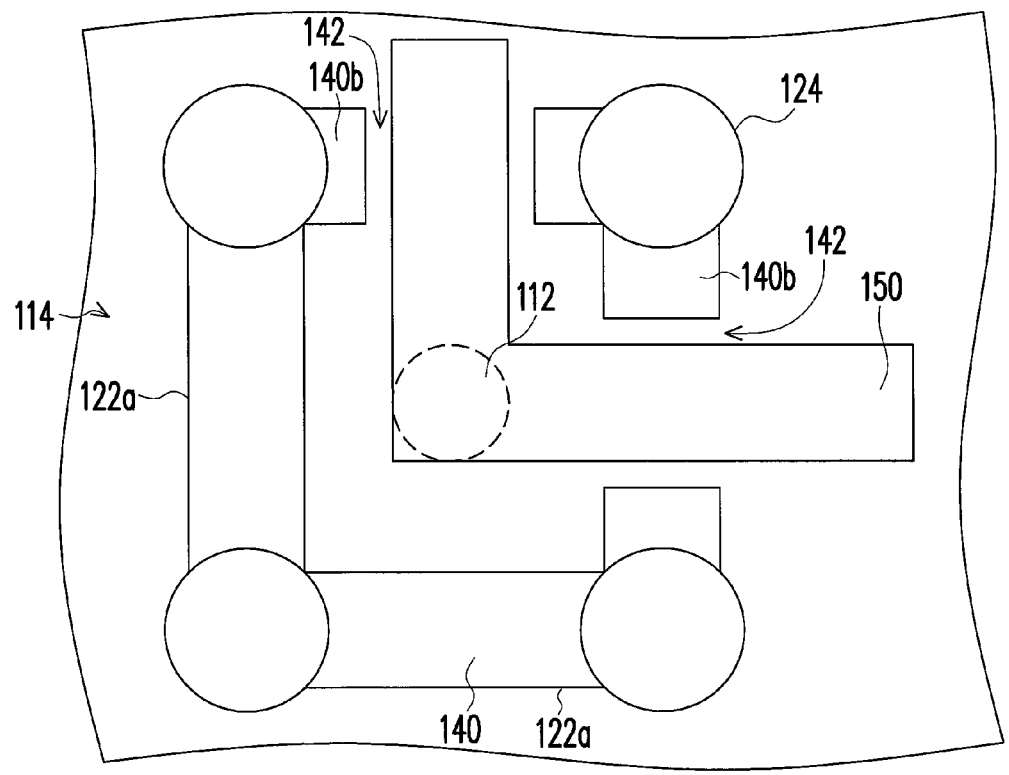
Figure 5C:
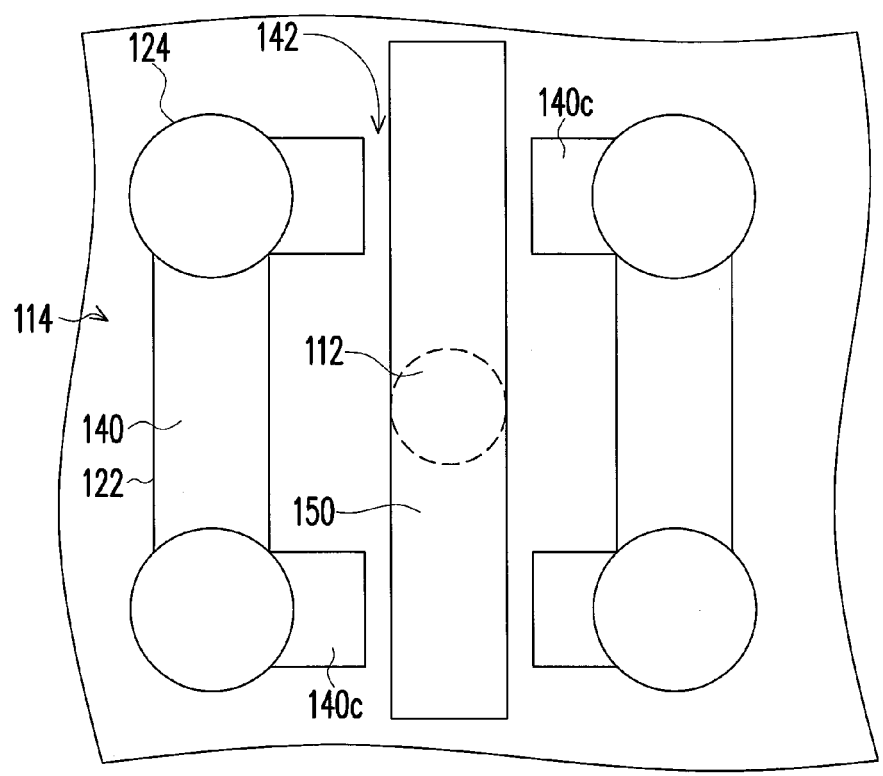

FIG. 5A to FIG. 5E are top, partial views illustrating the reinforcing structures according to five different embodiments of the present disclosure, respectively. The second reinforcing element is not shown in the reinforcing structures of FIG. 5A to FIG. 5E for clearly showing the structures below the second reinforcing element. Referring to FIG. 5A, the first reinforcing structure 122a includes a plurality of reinforcing sections 140 connected with the connecting element 124 in series. The semiconductor device stacked structure further includes a circuit 150 disposed on the first surface 114. One end of the circuit 150 is connected to the TSV 112, and the other end of the circuit 150 extends toward one of the reinforcing sections 140a, and the one reinforcing section 140a has an opening 142 allowing the circuit 150 to pass therethrough. In another embodiment of the present disclosure, as shown in FIG. 5B, the two ends of the circuit 150 extend toward two adjacent reinforcing sections 140, respectively, and the two adjacent reinforcing sections 140 each have an opening 142 allowing a corresponding one of the two ends of the circuit 150 to pass therethrough. The circuit 50 forms a nearly 90-degree bend at a location where the circuit 50 is connected to the TSV 112. In another embodiment of the present disclosure, as shown in FIG. 5C, the two ends of the circuit 150 extend toward two opposing reinforcing sections 140c, respectively, and the two opposing reinforcing sections 140c each have an opening 142 allowing a corresponding one of the two ends of the circuit 150 to pass therethrough. With the constructions described above, the TSV 112 can be electrically connected with other elements on the semiconductor devices 110 through the circuit 150.

Figure 5D:
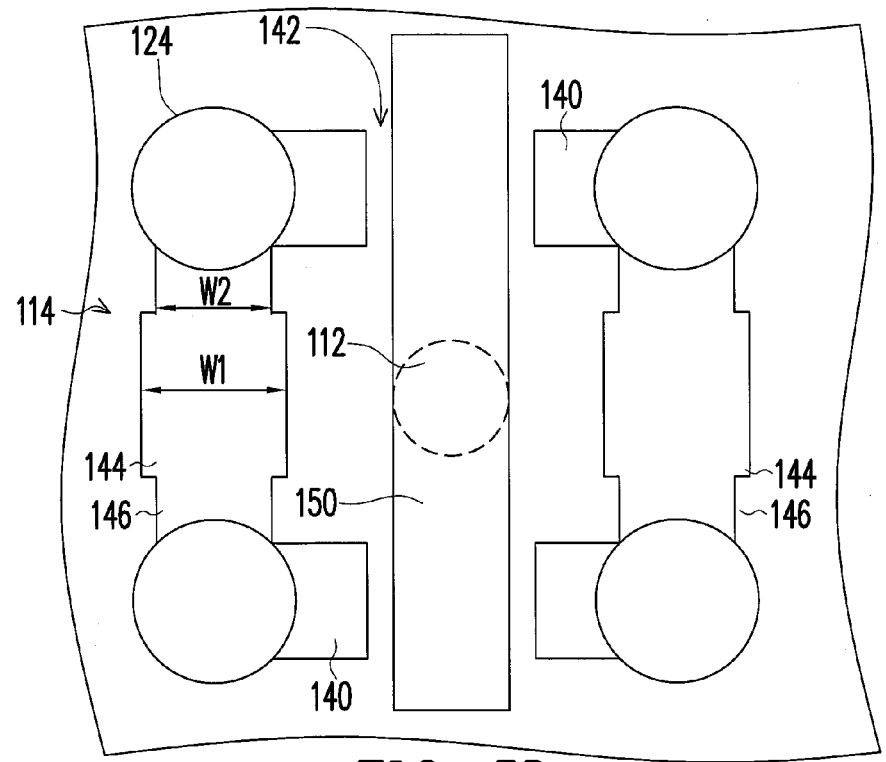
Figure 5E:
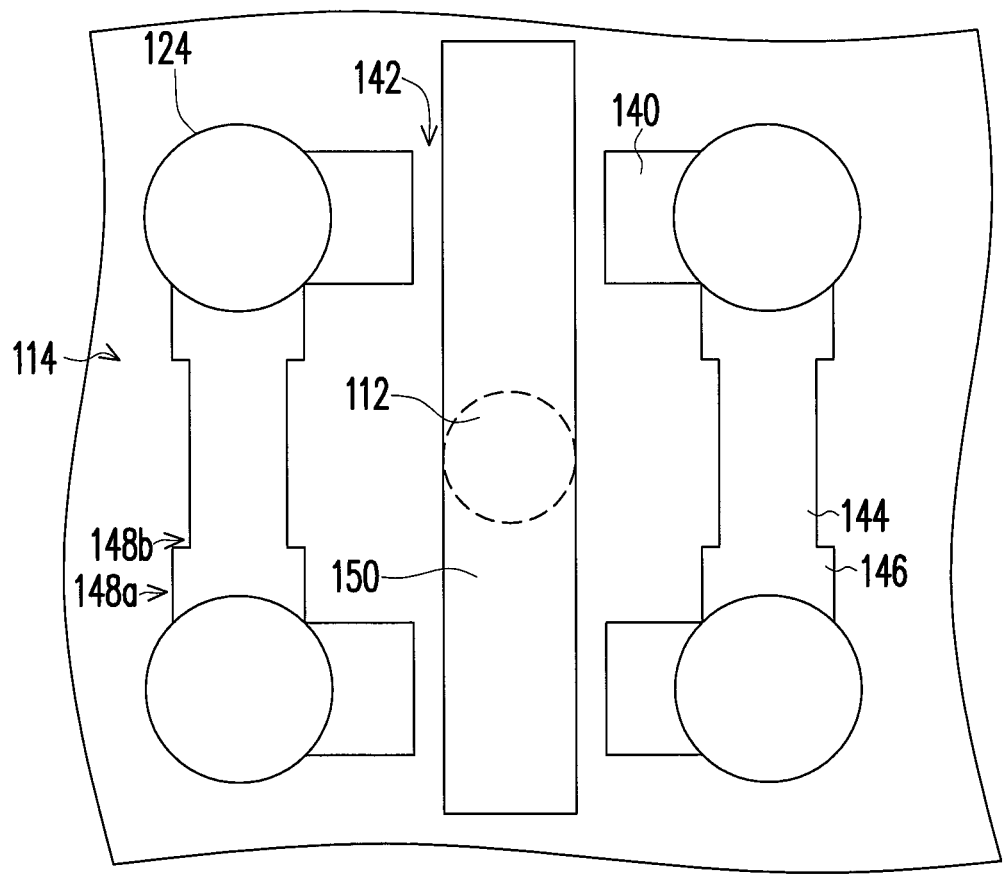

Further, the width and shape of the reinforcing sections 140 may vary according to a layout of the circuit and elements on or a thermal stress magnitude distribution in the semiconductor devices 110. For example, as shown in FIG. 5D and FIG. 5E, at least one of the reinforcing sections 140 may include a first portion 144 and a second portion 146, with the width W1 of the first portion 144 greater than the width W2 of the second portion 146. Alternatively, an edge of the reinforcing element 122 may include at least one projection portion 148a or at least one cutout 148b. As such, the reinforcing sections 140 may change their width or form the cutout 148 to bypass the circuit and elements on the semiconductor devices 110 according to the layout of circuit and elements on the semiconductor devices 110. Further, the width of those portions of the reinforcing sections 140 that correspond to large thermal stress areas in the semiconductor devices 110 may be widened or those portions may be provided with the projection portions 148a to increase structure strength, according to the thermal stress magnitude distribution in the semiconductor devices 110.

Table 1 below shows a comparison between the maximum stress withstood by the semiconductor device stacked structures of the five embodiments of the present disclosure and the maximum stress withstood by the conventional semiconductor device stacked structure. The conventional semiconductor device stacked structure is a semiconductor device without a reinforcing structure. As can be concluded from Table 1 below, in comparison with the conventional semiconductor device stacked structure, the presently disclosed semiconductor device stacked structures can in principle reduce the internal stress therein.

TABLE 1

|  | Conventional Semiconductor Device Stacked Structure | Embodiment Of The Present Disclosure 5(a) | Embodiment Of The Present Disclosure 5(b) | Embodiment Of The Present Disclosure 5(c) | Embodiment Of The Present Disclosure 5(d) | Embodiment Of The Present Disclosure 5(e) |
|---|---|---|---|---|---|---|
| Maximum Stress Withstood By Semiconductor Device (MPa) | 189.4817 | 129.83 | 136.3246 | 145.8459 | 131.0099 | 133.4682 |
| Maximum Stress Withstood By TSV(MPa) | 206.2598 | 134.404 | 140.005 | 149.9921 | 138.2135 | 139.7153 |

In summary, in the present disclosure, a reinforcing structure is disposed between the semiconductor devices to surround a TSV of the semiconductor devices. In embodiments of the present disclosure, the reinforcing structure may further change the width of reinforcing sections of the reinforcing structure to increase applicability and flexibility of the reinforcing structure according to a layout of circuit and elements on or a stress magnitude distribution in the semiconductor devices.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A semiconductor device stacked structure comprising:
   a plurality of semiconductor devices stacked on one another, at least one semiconductor device having at least one through silicon via; and
   at least one reinforcing structure, each of the at least one reinforcing structure surrounding a corresponding one of the at least one through silicon via and electrically insulated from the semiconductor devices, the at least one reinforcing structure comprising:
   a plurality of reinforcing elements disposed between the semiconductor devices, the plurality of reinforcing elements are overlapped with each other in a vertical direction and surround a vertical projection of the at least one through silicon via; and
   at least one connecting element located between overlapping regions in the vertical direction of the plurality of reinforcing elements, for connecting the plurality of reinforcing elements to form the reinforcing structure.

2. The semiconductor device stacked structure according to claim 1, wherein the ratio of an outer diameter of each connecting element to a width of each reinforcing element is greater than or equal to 0.5 but less than or equal to 1.5.

3. The semiconductor device stacked structure according to claim 1, wherein the ratio of an outer diameter of the at least one through silicon via to an outer diameter of each connecting element is less than or equal to 2.

4. The semiconductor device stacked structure according to claim 1, wherein a distance from a center of the at least one through silicon via to a center of each connecting element is L, an outer diameter of the at least one through silicon via is d, an outer diameter of each connecting element is D, where $L \leq 2(d+D)$.

5. The semiconductor device stacked structure according to claim 1, wherein each semiconductor device comprises a chip, an interposer, a wafer or a package.

6. The semiconductor device stacked structure according to claim 1, wherein each connecting element is round, square or triangular in shape.

7. The semiconductor device stacked structure according to claim 1, wherein the ratio of the coefficient of thermal expansion of the material of each connecting element to that of the at least one through silicon via ranges between 0.75 and 1.25.

8. The semiconductor device stacked structure according to claim 1, wherein the material of each connecting element is a metal having a coefficient of thermal expansion similar to that of the at least one through silicon via.

9. The semiconductor device stacked structure according to claim 1, wherein the semiconductor devices comprise a first semiconductor device and a second semiconductor device stacked on each other, the first semiconductor device comprises a first surface, the first surface faces a second surface of the second semiconductor device, the at least one through silicon via is located in the first semiconductor device, the reinforcing elements comprise at least one first reinforcing element disposed on the first surface and at least one second reinforcing element disposed on the second surface, and the at least one connecting element is disposed between the first surface and the second surface for interconnecting the at least one first reinforcing element and the at least one second reinforcing element.

10. The semiconductor device stacked structure according to claim 9, wherein the first reinforcing element comprises a first surface layer metal pattern of the first semiconductor device.

11. The semiconductor device stacked structure according to claim 9, wherein the second reinforcing element comprises a second surface layer metal pattern of the second semiconductor device.

12. The semiconductor device stacked structure according to claim 1, wherein each connecting element comprises a solder ball.

13. The semiconductor device stacked structure according to claim 9, further comprising a buffer layer disposed between the first reinforcing element and the second reinforcing element.

14. The semiconductor device stacked structure according to claim 9, wherein the at least one connecting element comprises a plurality of connecting elements, and the first reinforcing element comprises a plurality of reinforcing sections connected with the at least one connecting elements in series.

15. The semiconductor device stacked structure according to claim 14, further comprising a circuit disposed on the first surface, one end of the circuit connected to the at least one through silicon via, and one of the plurality of reinforcing sections has an opening allowing the circuit to pass therethrough.

16. The semiconductor device stacked structure according to claim 14, further comprising a circuit disposed on the first surface, the circuit connected to the at least one through silicon via, two ends of the circuit extending toward two adjacent reinforcing sections, respectively, and the two adjacent reinforcing sections each having an opening allowing a corresponding one of the two ends of the circuit to pass therethrough.

17. The semiconductor device stacked structure according to claim 16, wherein the circuit forms a nearly 90-degree bend at a location where the circuit is connected to the at least one through silicon via.

18. The semiconductor device stacked structure according to claim 14, further comprising a circuit disposed on the first surface, the circuit connected to the at least one through silicon via, two ends of the circuit extending toward two opposing reinforcing sections, respectively, and the two opposing reinforcing sections each having an opening allowing a corresponding one of the two ends of the circuit to pass therethrough.

19. The semiconductor device stacked structure according to claim 14, wherein at least one of the plurality of reinforcing sections comprises a first portion and a second portion, with the width of the first portion greater than the width of the second portion.

20. The semiconductor device stacked structure according to claim 1, wherein an edge of each reinforcing element comprises at least one projection portion or at least one cutout.

21. The semiconductor device stacked structure according to claim 1, wherein the material of each connecting element comprises gold, tungsten, copper, tin, steel, iron, and composite, compound and alloy of the above metals.

* * * * *